(12) United States Patent
Yu

(10) Patent No.: US 6,410,965 B1
(45) Date of Patent: Jun. 25, 2002

(54) ANNULAR SCR DEVICE

(75) Inventor: Ta-Lee Yu, Hsinchu Hsien (TW)

(73) Assignee: Winbond Electronics Corporation, Hsinchu (TW)

( * ) Notice: Subject to any disclaimer, the term of this patent is extended or adjusted under 35 U.S.C. 154(b) by 0 days.

(21) Appl. No.: 09/502,162

(22) Filed: Feb. 11, 2000

(30) Foreign Application Priority Data

Oct. 2, 1999 (TW) ........................................ 88116990 A

(51) Int. Cl.[7] .............................................. H01L 23/62
(52) U.S. Cl. ........................................ 257/356; 257/162
(58) Field of Search ................................ 257/356, 162

(56) References Cited

U.S. PATENT DOCUMENTS 5,852,315 A * 12/1998 Ker ............................ 257/355
5,986,290 A * 11/1999 Apfel ......................... 257/162
6,097,066 A *  8/2000 Lee ............................ 257/356
6,236,087 B1 *  5/2001 Daly ........................... 257/355

* cited by examiner

Primary Examiner—Jerome Jackson, Jr.
(74) Attorney, Agent, or Firm—Beyer Weaver & Thomas, LLP

(57) ABSTRACT

A SCR device having at least one annular unit provided on a first type semiconductor substrate. The annular unit comprises a second type well, a first type doping region, a second type contact ring, and a second type doping ring. The second type well is formed in the first type semiconductor substrate, and the first type doping region is formed in the second type well. The second type contact ring is formed in the second type well, surrounding the first type doping region. The second type doping ring is formed in the first type semiconductor substrate, surrounding the second type well.

14 Claims, 3 Drawing Sheets

ANNULAR SCR DEVICE

BACKGROUND OF THE INVENTION

1. Field of the Invention

The present invention relates to an integrated circuit anti-electrostatic discharge technique, and more particularly to a Lateral Semiconductor Controlled Rectifier with annular structure. This annular structure has a smaller layout size and provides better protection against electrostatic discharge.

2. Description of the Related Art

Due to the improvement of semiconductor technology, the size of CMOS devices (or components) have decreased to the level of sub-micrometer, and even half-micrometer. Following this trend, the semiconductor devices generally comprise thinner gate oxide layers, smaller transistor channels, sources and the drains with shallower junctions, lightly doped drain (LDD) structures, and are fabricated via the silicided diffusion process. The smaller structures and the use of the silicided diffusion process decrease the robustness of the integrated circuit against the electrostatic discharge (ESD).

The prior art uses the Lateral Semiconductor Controlled Rectifier (LSCR) as an ESD protection circuit to protect the sub-micrometer CMOS integrated circuit from being damaged by ESD. Such an example is disclosed in the U.S. Pat. No. 5,012,317. The top view and the cross-sectional view of a conventional LSCR formed in a P-type semiconductor 10 are shown in FIG. 1 and FIG. 2.

FIG. 1 and FIG. 2 display an N-type well 11 formed on a P-type semiconductor substrate 10, a P-type doping region 12 formed in the N-type well 11, and an N-type doping region 13 formed in the P-type semiconductor substrate 10. The P-type doping region 12, the N-type well 11, the P-type semiconductor substrate 10, and the N-type doping region 13 constitute an LSCR, and serve respectively as the anode, the anode gate, the cathode gate, and the cathode of the LSCR.

Furthermore, the N-type doping region 14 and the P-type doping region 15 are formed in the N-type well 11 and the P-type semiconductor substrate 10 respectively, and serve as the ohmic contact regions of the N-type well 11 and the P-type semiconductor substrate 10. Usually, the anode doping region 12 and the contact region 14 are connected to a pad of an integrated circuit, and the cathode doping region 13 and the contact region 15 are coupled to the $V_{SS}$ power source.

Briefly, the conventional structure of the LSCR has been designed with the layout of strip patterns, as shown in FIG. 2. The anode doping region 12, the cathode doping region 13, the contact region 14, and the contact region 15 have strip structures, and are disposed in parallel and set apart from each other. However, due to the trend of reducing the size of the integrated circuit, it is necessary to decrease the size of the LSCR structure. Therefore, it is an important issue in ESD protection circuit design to reduce the size of the LSCR structure while maintaining the protection of the integrated circuit from ESD.

SUMMARY OF THE INVENTION

The present invent provides an SCR device with a polygon structure, thereby economizing the size of the layout and the cost, and maintaining the protection of the integrated circuit from electrostatic discharge.

In order to achieve the above object, the present invention provides a SCR device. The SCR device has at least one annular unit formed on a first conductive type semiconductor substrate. The annular cell comprises a second conductivity type well, a first conductivity type doping region, a second conductivity type contact ring, and a second conductivity type doping ring. The second conductivity type well is in the first conductivity type semiconductor substrate, and the first conductivity type doping region is in the second conductivity type well. The second contact ring is in the second conductivity type well, which is surrounding the first conductivity type doping region. The second doping ring is in the first conductivity type semiconductor substrate, which is surrounding the second conductivity type well.

The size of the SCR component can be decreased when the structure formed in an annular shape. Furthermore, the symmetrical structure allows the current through the structure to be increased. The use of the SCR component as the electrostatic discharge protection circuit will therefore increase the protection of the integrated circuit from electrostatic discharge.

Furthermore, the present invent provides a SCR component, which has at least one annular cell formed on a first conductivity type semiconductor substrate and comprising: a second conductivity type floating well, a first conductivity type doping region, and a second conductivity type doping ring. The second conductivity type floating well is formed on the first conductivity type semiconductor substrate, the first conductivity type doping region is formed on the second conductivity type floating well, the second conductivity type doping ring is formed on the first conductivity type semiconductor substrate, which is surrounding the second conductivity type floating well.

Because there is no contact region set on the second type conductivity well, the present invent can decrease the trigger voltage of the SCR component.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

According to the present invention, the annular SCR device can be implemented by adopting the technique of P-type structure/N-type well, N-type structure/P-type well, or twin wells.

First Embodiment

Figure 1:
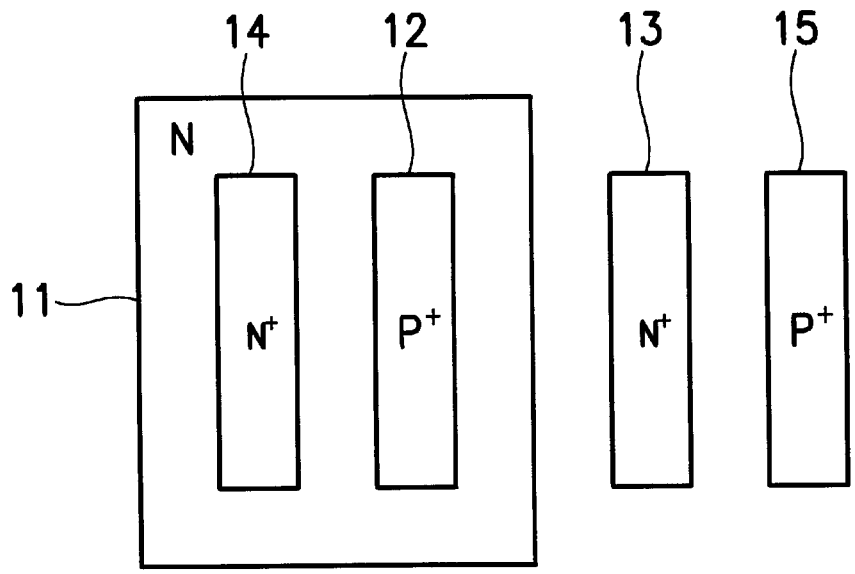
FIG. 1 shows a top view of the LSCR formed on a semiconductor substrate according to the prior art.
Figure 2:
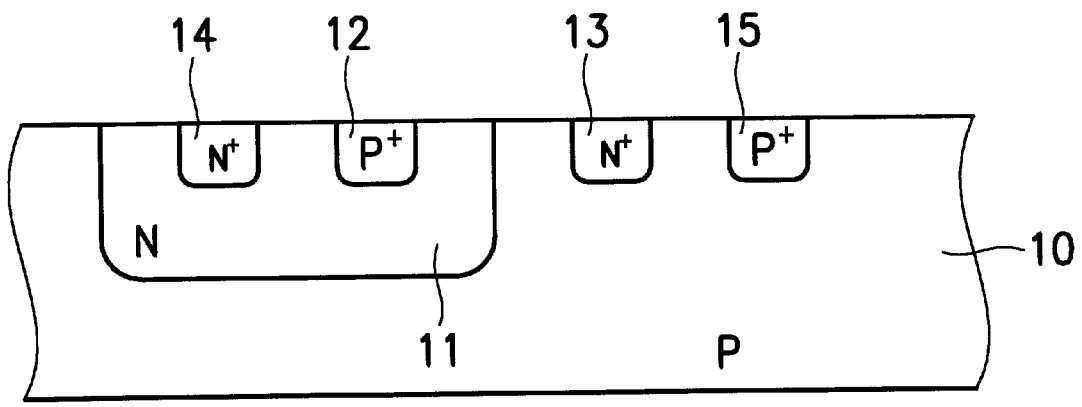
FIG. 2 shows a cross-sectional view of the LSCR formed on a semiconductor substrate according to the prior art.
Figure 3:
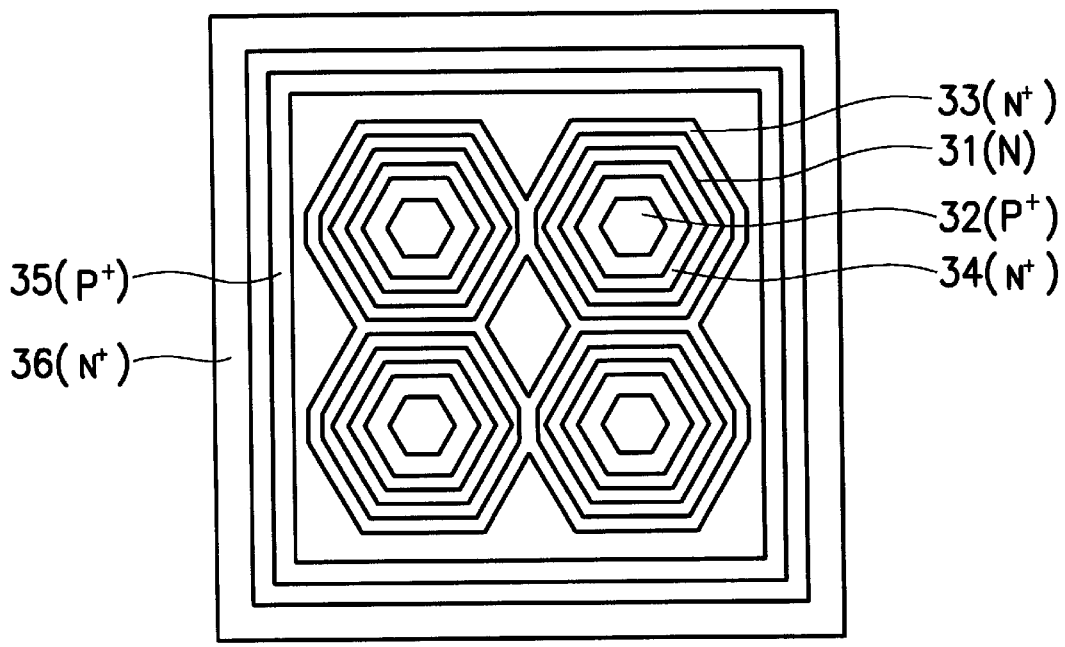
FIG. 3 shows a top view of an annular SCR device according to a first embodiment of the present invention.

FIG. 3 shows the top view of the annular SCR device according to a first embodiment of the present invention. The annular SCR is fabricated on a P-type semiconductor structure 30 and an N-type well 31. FIG. 3 displays an annular SCR device comprising four annular units, built in the same shape, size, and structure. In every annular unit, a $P^+$-type anode doping region 32 is formed in the N-type well 31. Preferably, the $P^+$-type anode doping region 32 is formed close to the center of the N-type well 31. Additionally, the annular $N^+$-type doping region 34 around the $P^+$-type anode doping region 32 is formed in the N-type well 31 as the contact region of the N-type well 31. Furthermore, the annular $N^+$-type cathode doping region 33 surrounding the N-type well 31 is formed within the P-type substrate 30.

The four annular units are enclosed within the $P^+$-type contact ring 35, which is surrounded by an $N^+$-type protection ring 36. Because the P-type semiconductor 30 is the substrate of the SCR device in this embodiment, the $P^+$-type contact ring 35 is formed on the $P^+$-type doping region of the semiconductor substrate 30 to provide a suitable bias voltage for the P-type semiconductor substrate 30. Surrounding the $P^+$-type contact ring 35, the $N^+$-type protection ring 36 is formed on the $N^+$-type doping region and coupled to the $V_{DD}$ power source to avoid the latchup effect.

Referring to FIG. 3, the N-type well 31, $P^+$-type anode doping region 32, $N^+$-type cathode doping region 33, and $N^+$-type annular contact doping region 34 are in the shape of a hexagon, but this should not be used to limit the invention. Any shapes that form an enclosed ring can be suitably adapted the present invention.

The size of the SCR device can be decreased when the structure of SCR device is formed in an annular shape. Furthermore, this symmetrical structure allows the current through the structure to be increased. This will therefore increase the protection against electrostatic discharge when the SCR component is used as the electrostatic discharge protection circuit. The number of the annular units in the protection ring can be varied to meet the needs of the circuit.

Second Embodiment

Figure 4:
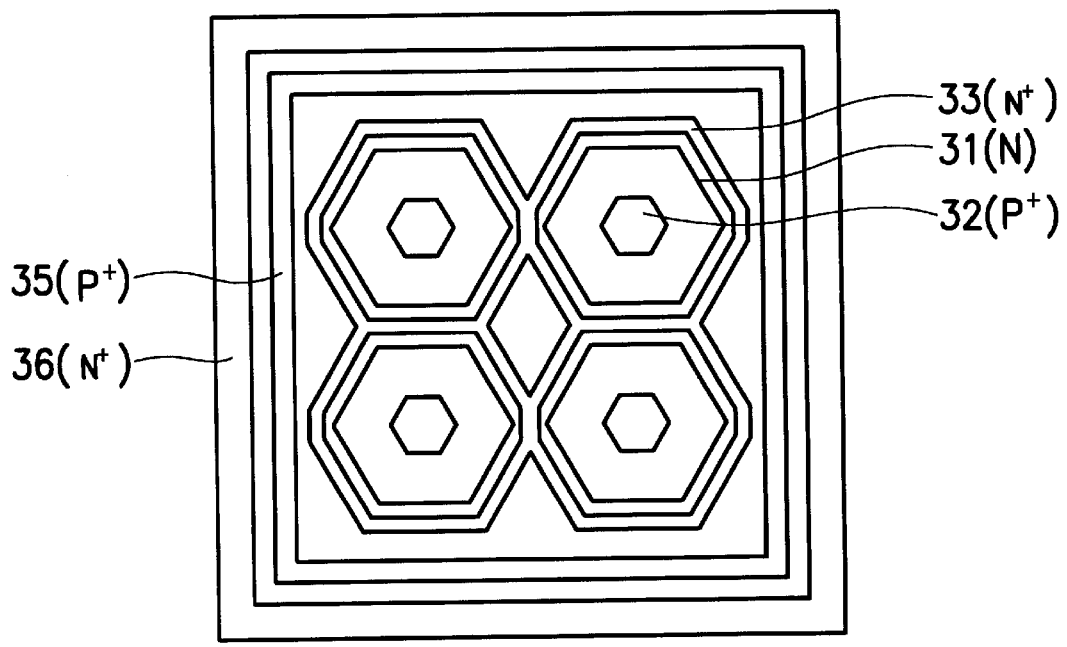
FIG. 4 shows a top view of an annular SCR component according to a second embodiment of the present invention.

FIG. 4 shows the top view of the annular SCR device of the second embodiment. The difference between the first embodiment and the second embodiment is that there is no annular $N^+$-type contact doping regions 34 formed in the N-type well 31; therefore, the N-type well is in the floating state, which can decrease the trigger voltage of the SCR device.

Third Embodiment

Figure 5:
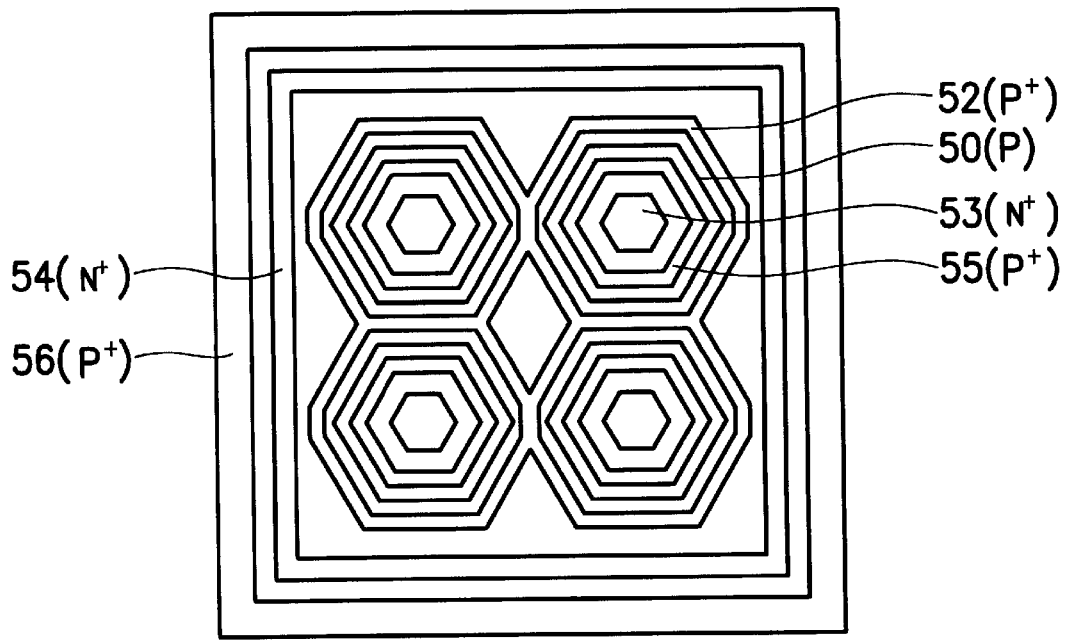
FIG. 5 shows a top view of an annular SCR component according to a third embodiment of the present invention.

FIG. 5 shows the top view of the annular SCR device of the third embodiment. The annular SCR device is fabricated on an N-type semiconductor structure 51 and a P-type well 50. FIG. 5 displays an annular SCR device comprising four annular units, built in the same shape, size, and structure. In every annular unit, an $N^+$-type cathode doping region 53 is formed in the P-type well 50. Preferably, the $N^+$-type cathode doping region 53 is formed close to the center of the P-type well 50. Additionally, the annular $P^+$-type doping region 55 around the $N^+$-type cathode doping region 53 is formed in the P-type well 50 as the contact region of the P-type well 50. Furthermore, the annular $P^+$-type anode doping region 52 surrounding the P-type well 50 is formed within the N-type substrate 51.

The four annular units are enclosed within the $N^+$-type contact ring 54, which is surrounded by a $P^+$-type protection ring 56. Because the N-type semiconductor 51 is the substrate of the SCR device in this embodiment, the $N^+$-type contact ring 54 is formed on the $N^+$-type doping region of the semiconductor substrate 51 to provide the suitable bias voltage for the N-type semiconductor substrate 51. Surrounding the $N^+$-type contact ring 54, the $P^+$-type protect ring 56 is formed on the $P^+$-type doping region and coupled to the $V_{DD}$ power source to avoid the latchup effect.

Referring to FIG. 5, the P-type well 50, $N^+$-type cathode doping region 53, $P^+$-type anode doping region 52, and $P^+$-type annular contact doping region 55 are in the shape of hexagon, but this should not be used to limit the invention. Any shapes that form an enclosed ring can be suitably adapted the present invention.

The size of the SCR device can be decreased when the structure of SCR device is formed in an annular shape. Furthermore, this symmetrical structure allows the current through the structure to be increased. This will therefore increase the protection against electrostatic discharge when the SCR component is used as the electrostatic discharge protection circuit. The number of the annular units in the protection ring can be varied to meet the needs of the circuit.

Fourth Embodiment

Figure 6:
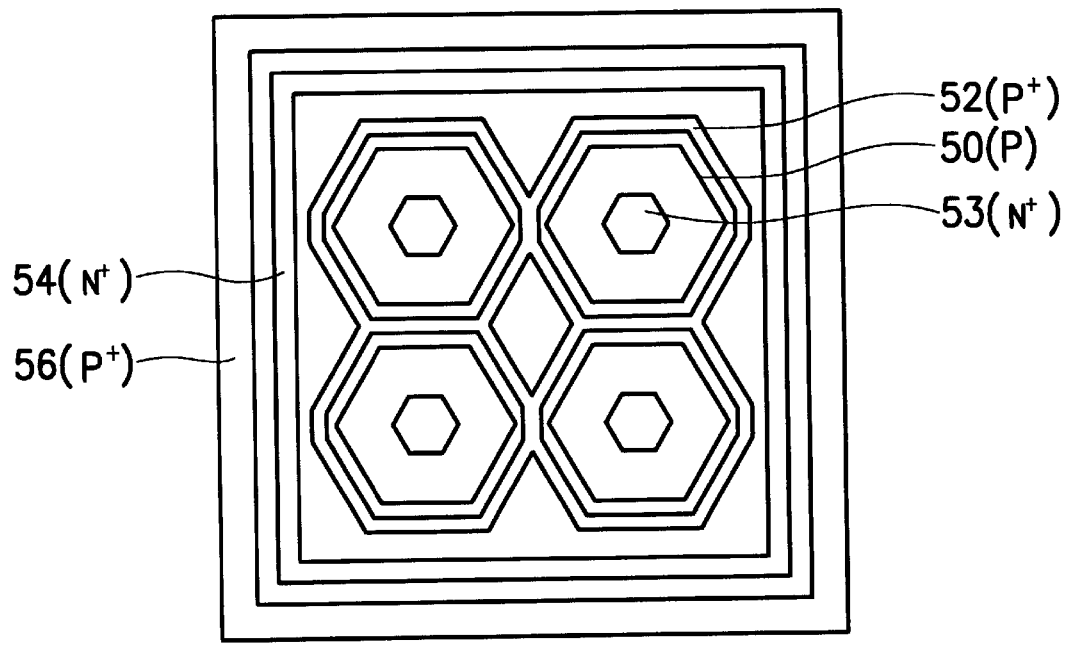
FIG. 6 shows a top view of an annular SCR component according to a fourth embodiment of the present invention.

FIG. 6 shows the top view of the annular SCR device of the fourth embodiment. The difference between the third embodiment and the fourth embodiment is that there is no annular $P^+$-type contact doping regions 55 formed in the P-type well 50; therefore, the P-type well is in the floating state, which can decrease the trigger voltage of the SCR device.

The foregoing description of the preferred embodiments of this invention have been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A SCR device having at least one annular unit formed on a first type semiconductor substrate, the annular unit comprising:

a second type well formed in the first type semiconductor substrate;

a first type doping region formed in the second type well;

a second type contact ring formed in the second type well, surrounding the first type doping region; and a second type doping ring, formed in the first type semiconductor substrate, surrounding the second type well.

2. The SCR device as claimed in claim 1, further comprising:

a first type contact ring formed in the first type semiconductor substrate, surrounding the annular unit; and a second type protection ring formed in the first type semiconductor substrate, surrounding the first type contact ring.

3. The SCR device as claimed in claim 2, wherein the first type is P-type and the second type is N-type.

4. The SCR device as claimed in claim 2, wherein the first type is N-type and the second type is P-type.

5. The SCR device as claimed in claim 1, wherein the contours of the second type contact ring and the second type doping ring are polygonal.

6. The SCR device as claimed in claim 1, wherein the contours of the second type contact ring and the second type doping ring are round.

7. The SCR device as claimed in claim 1, wherein the first type doping region is formed in the center of the second type well.

8. A SCR device having at least one annular unit formed on a first type semiconductor substrate, the annular unit comprising:
- a second type floating well formed in the first type semiconductor substrate;
- a first type doping region formed in the second type floating well; and
- a second type doping ring formed in the first type semiconductor substrate, surrounding the second type floating well.

9. The SCR device as claimed in claim 8, further comprising:
- a first type contact ring formed in the first type semiconductor substrate, surrounding the annular unit; and
- a second type protection ring formed in the first type semiconductor substrate, surrounding the first type contact ring.

10. The SCR device as claimed in claim 9, wherein the first type is P-type and the second conductivity type is N-type.

11. The SCR device as claimed in claim 9, wherein the first type is N-type and the second type is P-type.

12. The SCR device as claimed in claim 8, wherein the contour of the second type contact ring is polygonal.

13. The SCR device as claimed in claim 8, wherein the contour of the second type doping ring is round.

14. The SCR device as claimed in claim 8, wherein the first type doping region is formed in the center of the second type floating well.

* * * * *